(12) United States Patent
Ogata et al.

(10) Patent No.: US 8,932,952 B2
(45) Date of Patent: Jan. 13, 2015

(54) METHOD FOR POLISHING SILICON WAFER AND POLISHING LIQUID THEREFOR

(75) Inventors: Shinichi Ogata, Tokyo (JP); Ryuichi Tanimoto, Tokyo (JP); Ichiro Yamasaki, Tokyo (JP); Shunsuke Mikuriya, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 13/641,546

(22) PCT Filed: Mar. 23, 2011

(86) PCT No.: PCT/JP2011/056881
§ 371 (c)(1),
(2), (4) Date: Oct. 16, 2012

(87) PCT Pub. No.: WO2011/135949
PCT Pub. Date: Nov. 3, 2011

(65) Prior Publication Data
US 2013/0032573 A1    Feb. 7, 2013

(30) Foreign Application Priority Data

Apr. 30, 2010  (JP) ................... 2010-105900

(51) Int. Cl.
*H01L 21/302* (2006.01)
*H01L 21/02* (2006.01)
*B24B 37/08* (2012.01)
(Continued)

(52) U.S. Cl.
CPC .......... *H01L 21/02024* (2013.01); *B24B 37/08* (2013.01); *B24B 37/245* (2013.01); *B24B 37/044* (2013.01); *B24B 37/28* (2013.01)

USPC ............... 438/692; 216/53; 216/88; 216/89; 216/90; 216/91; 216/99; 257/E21.23; 438/689; 438/690; 438/691; 438/693

(58) Field of Classification Search
CPC .................... H01L 21/3212; H01L 21/30625; H01L 2224/11616; H01L 21/02008; C09G 1/02; C09K 3/1463; C09K 3/1409
See application file for complete search history.

(56) References Cited

U.S. PATENT DOCUMENTS 5,885,334 A * 3/1999 Suzuki et al. .................... 106/3
6,899,762 B2 * 5/2005 Wenski et al. ................. 117/89
(Continued)

FOREIGN PATENT DOCUMENTS

DE    10046933    4/2002
DE    10058305    6/2002
(Continued)

OTHER PUBLICATIONS

Korea Office action, mail date is Sep. 17, 2013.
(Continued)

*Primary Examiner* — Lan Vinh
*Assistant Examiner* — Jiong-Ping Lu
(74) *Attorney, Agent, or Firm* — Greenblum & Bernstein, P.L.C.

(57) ABSTRACT

Disclosed is a method for polishing a silicon wafer, wherein a surface to be polished of a silicon wafer is rough polished, while supplying a polishing liquid, which is obtained by adding a water-soluble polymer to an aqueous alkaline solution that contains no free abrasive grains, to a polishing cloth. Consequently, the surface to be polished can be polished at high polishing rate and the flatness of the edge portion including roll-off and roll-up can be controlled.

9 Claims, 5 Drawing Sheets

(51) Int. Cl.
*B24B 37/24* (2012.01)
*B24B 37/04* (2012.01)
*B24B 37/28* (2012.01)

(56) References Cited

U.S. PATENT DOCUMENTS

| | | | |
|---|---|---|---|
| 2001/0047978 A1* | 12/2001 | Wenski et al. | 216/2 |
| 2002/0055324 A1 | 5/2002 | Wenski et al. | |
| 2002/0077039 A1 | 6/2002 | Wenski et al. | |
| 2004/0098924 A1* | 5/2004 | Iwasa | 51/302 |
| 2006/0110924 A1 | 5/2006 | Ghosh et al. | |
| 2006/0178089 A1 | 8/2006 | Ueno | |
| 2007/0178812 A1* | 8/2007 | Shimomura et al. | 451/41 |
| 2009/0107851 A1 | 4/2009 | Kodera et al. | |
| 2009/0291559 A1* | 11/2009 | White et al. | 438/693 |
| 2009/0298394 A1 | 12/2009 | Katoh et al. | |
| 2009/0311460 A1 | 12/2009 | Hashii et al. | |
| 2012/0028547 A1 | 2/2012 | Takai | |

FOREIGN PATENT DOCUMENTS

| | | | |
|---|---|---|---|
| JP | 09-306881 | 11/1997 | ............ H01L 21/304 |
| JP | 2001-007063 | * 12/2001 | ............ H01L 21/304 |
| JP | 2002-231669 | 8/2002 | |
| JP | 2002-254299 | 9/2002 | |
| JP | 2005-123451 | 5/2005 | |
| JP | 2006-352042 | 12/2006 | |
| JP | 2009-50956 | 3/2009 | |
| JP | 2009-108405 | 5/2009 | |
| JP | 2009-113175 | 5/2009 | |
| JP | 2009-289873 | 12/2009 | ............ H01L 21/304 |
| JP | 2009-298680 | 12/2009 | |
| JP | 2010-21391 | 1/2010 | ............ H01L 21/304 |
| JP | 2010-040549 | 2/2010 | |
| TW | 200422138 | 11/2004 | |
| TW | 200624543 | 7/2006 | |

OTHER PUBLICATIONS

Taiwan Office action, mail date is Nov. 21, 2013.

German Office action, dated Mar. 6, 2014 along with an english translation thereof.

U.S. Appl. No. 13/805,463 to Ryuichi Tanimoto et al., filed Dec. 19, 2012.

U.S. Appl. No. 13/807,082 to Ryuichi Tanimoto et al., filed Dec. 27, 2012.

* cited by examiner

METHOD FOR POLISHING SILICON WAFER AND POLISHING LIQUID THEREFOR

TECHNICAL FIELD

This invention relates to a method for polishing silicon wafers and a polishing liquid for the method, and in particular, to a method for polishing silicon wafers for polishing at least the surface serving as a surface to be polished between the surface and the rear surface of the silicon wafer so as to relatively rotate a silicon wafer and an abrasive cloth while supplying a polishing liquid, and the polishing liquid for the method.

BACKGROUND ART

In recent years, as a method for polishing a surface of a silicon wafer, CMP (chemical mechanical polishing) which is carried out so as to relatively rotate the silicon wafer and an abrasive cloth while supplying a polishing liquid in which free abrasive grains such as silica grains are contained in an alkaline aqueous solution, is common. CMP has been known by that a mechanical polishing action by free abrasive grains and a chemical polishing action by an alkaline aqueous solution are combined, to be able to obtain high flatness with respect to the surface of a silicon wafer. In this CMP processing for silicon wafer, usually, polishing is carried out through multiple steps from rough polishing to final polishing.

The rough polishing at an initial step is carried out with the purpose of polishing a silicon wafer to be a desired thickness. The polishing is carried out under the condition of a relatively high polishing rate by use of a hard abrasive cloth of polyurethane or the like, that is, the polishing is carried out so as to reduce the variation in thickness of the silicon wafer after the polishing, to achieve flattening. In this rough polishing process, the polishing processing may be carried out so as to change the type of an abrasive cloth and the size of free abrasive grains, while splitting the amount of polishing the silicon wafer (elimination stock amount) into multiple steps (for example, 1 to 3 steps) in some cases.

The final polishing in the final step is carried out with the purpose of improving the roughness on the silicon wafer surface, and the polishing is carried out so as to reduce the variation in nano-surface roughness on the silicon wafer surface such as nanotopography or haze by use of a soft abrasive cloth such as suede, and micro-sized free abrasive grains. In the same way as the rough polishing process, in this final polishing as well, the polishing processing may be split into multiple steps to be carried out while changing the type of abrasive cloth and the size of free abrasive grains, in some cases.

However, in the case where rough polishing is carried out by use of a polishing liquid containing free abrasive grains (a slurry), a high polishing rate and a certain level of flatness of a wafer may be obtained. Meanwhile, new process damage has been brought about to the surface of the silicon wafer by a mechanical action during the polishing. Further, due to aggregation of the free abrasive grains in the polishing liquid, defects caused by a process such as micro-scratching have occurred on a polished surface of a silicon wafer. In many cases, process damage occurring in the rough polishing process and defects caused by a process are not eliminated even in the subsequent final polishing process, and in order to completely eliminate those, it is necessary to considerably increase the amount of polishing in the final polishing.

Then, as a conventional technology for solving this, for example, the invention disclosed in Patent Document 1 has been known. This invention is to polish the surface of a silicon wafer by use of a polishing liquid composed of an alkaline aqueous solution of pH8.5 to 13, which contains a water-soluble silicate component and an alkaline component, and substantively does not contain free abrasive grains. In this way, because free abrasive grains are not used, process damage to the surface of the silicon wafer is reduced. In addition, because the silicic acid molecules are coupled with silicon atoms on the wafer surface coupled with a hydroxyl group to form condensed silicate and accelerate elution of the silicon atoms into the alkaline aqueous solution, its polishing rate is therefore increased.

Patent Document 1: Japanese Published Unexamined Patent Application No. H9-306881.

DISCLOSURE OF INVENTION

Problems to be Solved by the Invention

Meanwhile, from the standpoint of the miniaturization of devices and the enlargement of a device formation region of a silicon wafer in recent years, high flatness is required in the vicinity of the outermost circumference of a silicon wafer, which has drawn increased attention to flatness in the vicinity of the outermost circumference and the amount of surface displacement of a wafer. In accordance therewith, an index ROA (Roll-Off Amount) in which a drop-off amount and a flip-up amount of the wafer outer circumferential portion are quantitatively expressed has been known in order to assess the shape of the outermost circumference of a silicon wafer.

This is to determine a virtual reference plane from a wafer shape at a position of 124 mm to 135 mm (Reference area) from the center of the wafer where a silicon wafer with a diameter of, for example, 300 mm is considered as being flat, and for example, when a ROA is 1 mm, it is defined as a height from the reference plane at a position of 1 mm inward from the wafer outer edge. At this time, given that the height of the reference plane is 0, from which the shape is dropped off up to the wafer outer edge, its amount of displacement is a minus value (roll-off), and when the shape is flipped up, its amount of displacement is a plus value (roll-up). Further, the lower the absolute values of roll-off and roll-up are, the higher the flatness even in the vicinity of the outermost circumference is assessed.

As shown in Patent Document 1, in the case where the surface of a silicon wafer is polished by use of a polishing liquid composed of an alkaline aqueous solution with no free abrasive grains, but containing a water-soluble silicate component, the polishing liquid flows in from the outer circumference to the center of the silicon wafer during the polishing processing. Therefore, a large quantity of alkaline aqueous solution having a significant amount of etching action touches the outer circumferential portion more than the central portion of the wafer. Therefore, a polishing rate at 3 mm from the outer circumferential edge of the silicon wafer is high, and the control of roll-off in the region of 3 mm or less from the wafer outer circumferential edge is imperfect in the same way as a case of CMP using a polishing liquid containing free abrasive grains. Further, depending on an alkali concentration change during polishing processing, the silicate component in the polishing liquid is turned into a gel, and this functions as a free abrasive grain in colloidal silica, which may cause process damage or cause a defect caused by a process.

Further, in recent years, it has been desired to provide a silicon wafer in which not only the surface side, but also the rear surface side of the silicon wafer is mirror-surface polished, and double-side polishing for simultaneously polishing the wafer surface and rear surface has been executed by use of a polishing liquid containing free abrasive grains in a rough polishing process.

As a double-side polishing device, in recent years, double-side polishing for simultaneously polishing the surface and the rear surface of the silicon wafer so as to insert the carrier plate with an upper surface plate and a lower surface plate on which abrasive cloths are pasted in a state in which a silicon wafer is housed in a carrier plate has been adopted.

In the case where such a double-side polishing device using a carrier plate is used, provided that the surface and the rear surface of the silicon wafer are polished until the thickness of a silicon wafer becomes a thickness which is equivalent to or less than the thickness of the carrier plate, the polishing itself onto the wafer outer circumferential portion by the abrasive cloths is inhibited by the carrier plate, thereby it is possible to reduce roll-off.

However, because the carrier plate itself is polished, the exchange frequency of the carrier plate is increased, which brings about the concern of the problem of increasing production costs.

Then, as a result of intensive research, the inventors have found that, provided that the surface of the wafer is polished while supplying a polishing liquid in which a water-soluble polymer is added to an alkaline aqueous solution with no free abrasive grains by use of hard abrasive cloth of polyurethane or the like in rough polishing of a surface of a silicon wafer, it is possible to keep the high polishing rate, and it is possible to arbitrarily control the roll-off amount of the outer circumferential portion of the silicon wafer by adjusting the concentration of the water-soluble polymer added, to be able to reduce the roll-off amount, and successfully completed this invention.

An object of the present invention is to provide a method for polishing silicon wafers, which is capable of polishing a surface to be polished of a silicon wafer at a high polishing rate, and achieving control of the flatness of the wafer outer circumferential portion including roll-off and roll-up, and to provide a polishing liquid for the method.

Means for Solving the Problems

A first aspect in accordance with the present invention provides a method for polishing silicon wafers including the steps of rough polishing at least the surface serving as a surface to be polished between a surface and a rear surface of the silicon wafer so as to relatively rotate a silicon wafer and an abrasive cloth while supplying a polishing liquid in which a water-soluble polymer is added to an alkaline aqueous solution with no free abrasive grains to the hard abrasive cloth, and applying final polishing on at least the rough polished surface of the silicon wafer.

A second aspect in accordance with the present invention provides a method for polishing silicon wafers including the steps of rough polishing at least the surface serving as a surface to be polished between a surface and a rear surface of the silicon wafer so as to relatively rotate a silicon wafer and an abrasive cloth, and applying final polishing on at least the rough polished surface of the silicon wafer after the rough polishing, the method in which the rough polishing is split into a first-step polishing which is carried out while supplying a first-step polishing liquid in which a water-soluble polymer is added to an alkaline aqueous solution with no free abrasive grains to the abrasive cloth, and a second-step polishing which is carried out while supplying a second-step polishing liquid in which a water-soluble polymer is added to an alkaline aqueous solution with no free abrasive grains to the abrasive cloth after the first-step polishing, and concentration of the water-soluble polymer in the second-step polishing liquid is made higher than the concentration of the water-soluble polymer in the first-step polishing liquid.

A third aspect in accordance with the present invention provides the method for polishing silicon wafers according to the first aspect or the second aspect, in which the water-soluble polymer is one type or several types from among non-ionic system polymers and monomers, or one type or several types from among anionic system polymers and monomers.

A fourth aspect in accordance with the present invention provides the method for polishing silicon wafers according to the third aspect, in which the water-soluble polymer is hydroxyethyl cellulose.

A fifth aspect in accordance with the present invention provides the method for polishing silicon wafers according to the fourth aspect, in which the concentration of the hydroxyethyl cellulose in the polishing liquid is 0.1 ppm to 1000 ppm.

A sixth aspect in accordance with the present invention provides the method for polishing silicon wafers according to the first aspect or the second aspect, in which the alkaline aqueous solution is adjusted to pH8 to pH13, and the alkaline aqueous solution is the alkaline aqueous solution to which any of basic ammonium salt, basic potassic salt, and basic sodium salt is added as an alkaline agent, or an alkaline carbonate aqueous solution, or an alkaline aqueous solution to which an amine is added.

A seventh aspect in accordance with the present invention provides the method for polishing silicon wafers according to the first aspect or the second aspect, in which the abrasive cloth is composed of a nonwoven cloth made of polyester, or is made of polyurethane.

An eighth aspect in accordance with the present invention provides the method for polishing silicon wafers according to the first aspect or the second aspect, in which the rough polishing simultaneously polishes the surface and the rear surface of the silicon wafer with a double-side polishing device which includes a carrier plate in which a silicon wafer is housed, and an upper surface plate in which the abrasive cloth is pasted on a lower surface and a lower surface plate in which the abrasive cloth is pasted on a top surface, which holds the carrier plate from above and below therebetween.

A ninth aspect in accordance with the present invention provides the method for polishing silicon wafers according to the eighth aspect, in which polishing is carried out such that a thickness of the silicon wafer after the rough polishing is made thicker than a thickness of the carrier plate.

A tenth aspect in accordance with the present invention provides a polishing liquid which is used at the time of rough polishing at least the surface serving as a surface to be polished between a surface and a rear surface of a silicon wafer, in which an alkaline aqueous solution with no free abrasive grains serves as a base compound, and a water-soluble polymer is added to the alkaline aqueous solution.

An eleventh aspect in accordance with the present invention provides the polishing liquid according to the tenth aspect, in which the alkaline aqueous solution is adjusted to pH8 to pH13, the alkaline aqueous solution is the alkaline aqueous solution to which any of basic ammonium salt, basic potassic salt, and basic sodium salt is added as an alkaline agent, or an alkaline carbonate aqueous solution, or an alkaline aqueous solution to which an amine is added, and the water-soluble polymer is one type or several types from among non-ionic system polymers and monomers, or one type or several types from among anionic system polymers and monomers.

A twelfth aspect in accordance with the present invention provides the polishing liquid according to the tenth aspect or the eleventh aspect, in which the water-soluble polymer is hydroxyethyl cellulose.

A thirteenth aspect in accordance with the present invention provides the polishing liquid according to the twelfth aspect, in which the concentration of the hydroxyethyl cellulose in the alkaline aqueous solution is adjusted to be within a range of concentration from 0.1 ppm to 1000 ppm.

Advantageous Effect of the Invention

In accordance with the method for polishing silicon wafers and a polishing liquid for the method of the present invention, it is possible to reduce roll-off of a wafer outer circumferential portion while keeping a high polishing rate, which results in making capable flatness (ROA) control of the wafer outer circumferential portion including roll-off and roll-up. Further, it is possible to reduce generation of process damage and defect generation caused by a process such as micro-scratching caused by an aggregation of abrasive grains.

DESCRIPTION OF SYMBOLS

Figure 1:
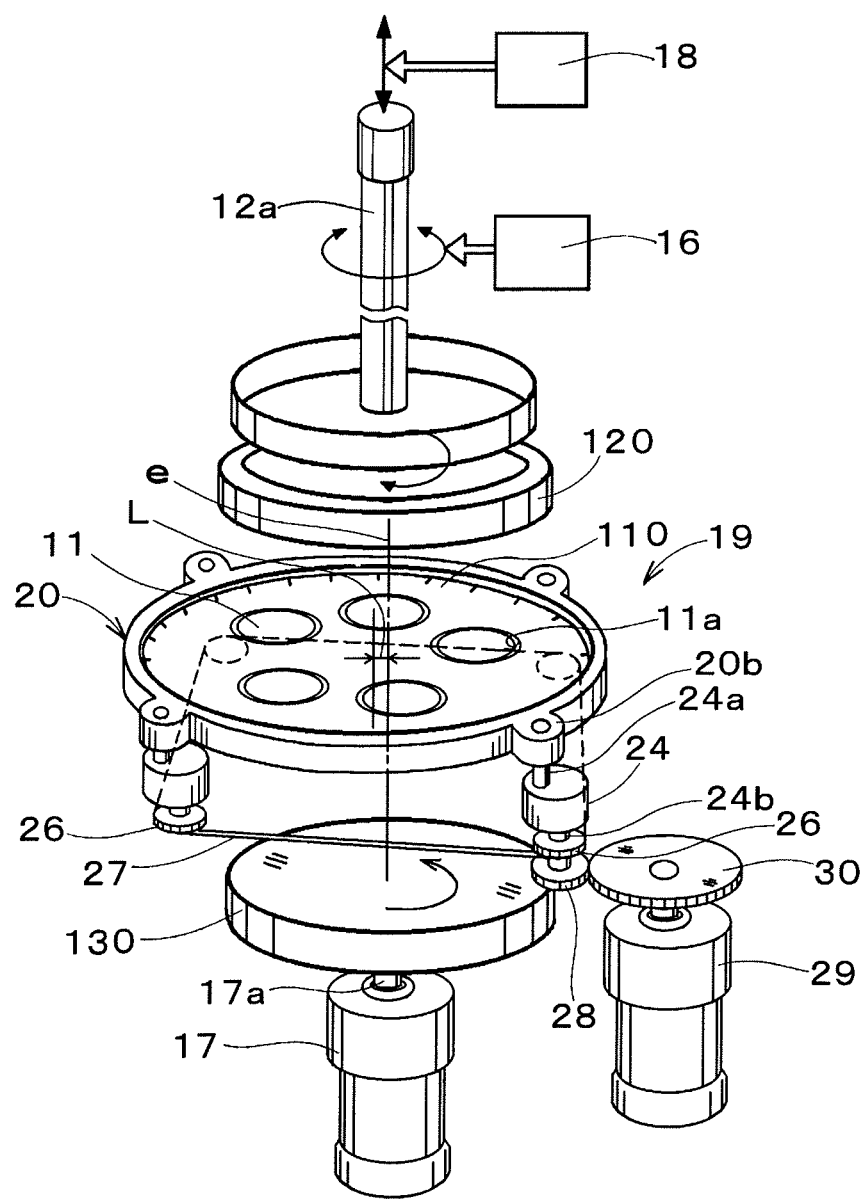
FIG. 1 is a perspective view of a non-sun gear system double-side polishing device, which is used for a method for polishing silicon wafers of Example 1 according to the present invention.

10 . . . Double-side polishing device,
11 . . . Silicon wafer,
15 . . . Abrasive cloth,
110 . . . Carrier plate,
120 . . . Upper surface plate,
130 . . . Lower surface plate

BEST MODES FOR CARRYING CUT THE INVENTION

A method for polishing silicon wafers of the present invention includes the processes of rough polishing at least the surface serving as a surface to be polished between a surface and a rear surface of the silicon wafer so as to relatively rotate a silicon wafer and the abrasive cloth while supplying a polishing liquid in which a water-soluble polymer is added to an alkaline aqueous solution with no free abrasive grains to a hard abrasive cloth, and applying final polishing on at least the rough polished surface of the silicon wafer.

Further, another method for polishing silicon wafers of the present invention includes the processes of rough polishing at least the surface serving as a surface to be polished between a surface and a rear surface of the silicon wafer so as to relatively rotate a silicon wafer and the abrasive cloth, and applying final polishing on at least the rough polished surface of the silicon wafer, the method in which the rough polishing is split into a first-step polishing which is carried out while supplying a first-step polishing liquid in which a water-soluble polymer is added to an alkaline aqueous solution with no free abrasive grains to the abrasive cloth, and a second-step polishing which is carried out while supplying a second-step polishing liquid in which a water-soluble polymer is added to an alkaline aqueous solution with no free abrasive grains to the abrasive cloth after the first-step polishing, and concentration of the water-soluble polymer in the second-step polishing liquid is made higher than the concentration of the water-soluble polymer in the first-step polishing liquid.

According to these methods for polishing silicon wafers of the present invention, due to an etching action by the alkaline aqueous solution and an etching inhibitive action onto a silicon wafer outer circumferential portion by the water-soluble polymer, it is possible to reduce roll-off of the wafer outer circumferential portion while keeping a high polishing rate, which results in making capable flatness (ROA) control of the wafer outer circumferential portion including roll-off and roll-up.

Further, in a conventional polishing method using a polishing liquid containing free abrasive grains, roll-off of the wafer outer circumferential portion is accelerated according to the progress of polishing. Meanwhile, in the case of this invention, for example, by extending a polishing time to increase the amount of polishing, it is possible to make the wafer outer circumferential portion into a roll-up shape. Therefore, for example, roll-off of a wafer outer circumferential portion in final polishing may be assumed to achieve an ideal flat shape on an outer circumferential portion of a product wafer.

In addition, as the reason for reduction in roll-off, it is presumed that the following phenomenon may occur.

Because the water-soluble polymer in the polishing liquid is absorbed to the surface of the silicon wafer during the polishing processing, the wafer surface comes to be covered with the water-soluble polymer. However, because the polymer membrane formed on the surface to be polished (the plane to be polished) is eliminated by the abrasive cloth, and the surface to be polished from which the polymer membrane is eliminated is a reaction active hydrophilic surface, chemical etching is carried out by the alkaline aqueous solution. It can be considered that the polishing progresses by repeated polymer absorption, elimination of the polymer membrane, and alkaline etching. Then, because the polishing liquid flows from the wafer outer edge toward the center, and a large quantity of polishing liquid is supplied to the wafer outer circumferential portion as compared with the wafer central portion, the polishing progresses in a state in which the amount of formation of polymer membrane to be formed is made larger than the amount of elimination of polymer membrane to be eliminated by the abrasive cloth in the wafer outer circumferential portion. It is thereby presumed that an etching reaction on the wafer outer circumferential portion is inhibited, to reduce a roll-off amount.

In the method for polishing silicon wafers of the present invention, an alkaline aqueous solution with no free abrasive grains is used as a polishing liquid. Here, the term the "alkaline aqueous solution with no free abrasive grains" means an alkaline aqueous in which free abrasive grains such as colloidal silica (abrasive grains), diamond abrasive grains, or alumina abrasive grains are not mixed into an alkaline aqueous solution serving as a base compound in a polishing liquid. With this, the surface to be polished of a silicon wafer is polished mainly by a chemical action. Therefore, it is possible to avoid generation of process damage by a chemical action such as conventional polishing using free abrasive grains. In addition, because the polishing does not use free abrasive grains, it is possible to reduce defect generation caused by a process such as micro-scratching caused by an aggregation of abrasive grains.

As an alkaline aqueous solution, one which is adjusted to be within a range from pH8 to pH13 is used. As a result, defects caused by a process such as scratching or scarring are not generated on the surface of the silicon wafer, it is easy to handle the polishing liquid, and it is possible to obtain a high polishing (etching) rate of the silicon wafer. In a case where the alkaline aqueous solution is less than pH8, an etching action becomes too low, which makes it easy to generate defects caused by a process such as scratching or scarring on the surface of the silicon wafer. Further, in a case of being higher than pH13 such as a strongly basic aqueous solution, it is difficult to handle the polishing liquid.

As an alkaline agent (pH adjuster) for the alkaline aqueous solution, for example, an alkaline aqueous solution to which any of basic ammonium salt, basic potassic salt, and basic sodium salt is added, or an alkaline carbonate aqueous solution, or an alkaline aqueous solution to which an amine is added. Otherwise, an aqueous solution of hydrazine or amines may be adopted. From the standpoint of increasing a polishing rate, it is preferable that ammonia-free alkali, particularly, an amine is used.

The content of the alkaline agent in the alkaline aqueous solution is 100 to 1000 ppm. When it is less than 100 ppm, the etching force onto the surface of the silicon wafer by the alkaline agent is not sufficient, and it takes a long time for polishing the silicon wafer to a predetermined thickness. When it is over 1000 ppm, it is difficult to handle the polishing liquid itself, and further, surface roughness is easily generated on the wafer surface by an excess etching reaction.

Further, as the other aspect of the present invention, the rough polishing may be split into a first-step polishing using a first-step polishing liquid and a second-step polishing using a second-step polishing liquid, and concentration of the water-soluble polymer in the second-step polishing liquid may be made higher than the concentration of the water-soluble polymer in the first-step polishing liquid.

That is, because higher productivity is required for rough polishing, it is necessary to polish silicon wafers under a polishing condition in which a polishing rate is increased as high as possible. Accordingly, by lowering the concentration of the water-soluble polymer in the first-step polishing liquid used for first-step polishing carried out from the beginning of the start of polishing, it is possible to increase the polishing rate. Then, after the first-step polishing, by executing the second-step polishing using the second-step polishing liquid in which the concentration of the water-soluble polymer is increased, it is possible to inhibit roll-off from being generated on the outer circumferential part of the wafer.

In this way, after the first-step polishing in which the amount of polishing is increased at a high polishing rate, the second-step polishing is carried out onto the polished surface of the silicon wafer on which the first-step polishing is carried out by use of the second-step polishing liquid in which an additive amount of the water-soluble polymer is increased. Therefore, a polishing time of the silicon wafer on which roll-off of the outer circumferential portion is reduced is shortened, which makes it possible to improve productivity of mirrored silicon wafers.

The concentration of the water-soluble polymer in the polishing liquid used for the first-step polishing is preferably 10 ppm or less, which makes it possible to polish a silicon wafer while keeping a high polishing rate without impairing the etching action by the alkaline aqueous solution.

The polishing condition for the second-step polishing may be the same as or different from the polishing condition for the first-step polishing except for the additive amount of the water-soluble polymer. Further, as a type of the water-soluble polymer, the same type may be used or the type may be changed in the first-step polishing and the second-step polishing. In the second-step polishing, a polishing device used for the first-step polishing is continuously used immediately after the first-step polishing, and the additive amount of the water-soluble polymer in the polishing liquid supplied to the abrasive cloth may be merely changed (increased). Further, another polishing device different from the polishing device used for the first-step polishing may be used.

As a water-soluble polymer, anionic, non-ionic, and ampholytic respective polymers and respective monomers are used. In detail, as a water-soluble polymer, hydroxyethyl cellulose or polyethylene glycols is preferably used. In particular, highly-pure hydroxyethyl cellulose is relatively easily available, and a polymer membrane is easily formed on a wafer surface. Therefore, hydroxyethyl cellulose has the characteristic of a high effect of inhibiting an etching reaction by alkali. However, among respective types of water-soluble polymers, one for accelerating etching on a silicon wafer by an alkaline aqueous solution is not suitable. Only one type of water-soluble polymer may be used, or a plurality of types of water-soluble polymers may be used.

Further, in place of a water-soluble polymer, a surface acting agent or aliphatic alcohol may be used. As a surface acting agent, for example, polyoxyethylene alkyl ether or the like may be adopted. Further, as aliphatic alcohol, for example, polyvinyl alcohol or the like may be adopted.

The concentration of the water-soluble polymer in the polishing liquid may be set within a range of concentration from 0.1 ppm to 1000 ppm, and particularly, it is preferable to be less than or equal to 100 ppm. In the case where hydroxyethyl cellulose is adopted as a water-soluble polymer, its additive amount is preferably 100 ppm or less. Excessive addition considerably lowers a polishing rate of the silicon wafer, which results in lower productivity.

As a silicon wafer, for example, a monocrystalline silicon wafer, a polycrystalline silicon wafer, or the like may be adopted. Further, as a diameter of the silicon wafer, for example, 100 mm, 125 mm, 150 mm, 200 mm, 300 mm, 450 mm, or the like may be cited.

As a silicon wafer to be rough polished, a silicon wafer in which no oxide film is present at least on the surface serving as a surface to be polished between the surface and the rear surface is used. This is because, usually, a native oxide film of approximately 5 to 20 Å is present on a surface of a silicon wafer before a rough polishing process, which makes it difficult to eliminate the native oxide film by the alkaline aqueous solution with no free abrasive grains.

For eliminating the native oxide film, a method for eliminating native oxide film by etching processing using a solution such as hydrofluoric acid, a method for eliminating native oxide film by polishing processing using a polishing liquid containing free abrasive grains, or the like may be adopted before carrying out rough polishing. In addition, in the case where the native oxide film is eliminated by polishing processing using a polishing liquid containing free abrasive grains, not only the native oxide film, but also the wafer surface may be polished so as to reduce the amount of polishing by rough polishing.

A hard material is used as an abrasive cloth. Thereby, it is possible to achieve reduction in roll-off amount of the outer circumferential portion of the silicon wafer. That is, because the polishing processing is carried out in a state in which the silicon wafer is pressed against the abrasive cloth, given that a soft abrasive cloth is used, the silicon wafer is subducted into the abrasive cloth, and the action of reaction force by which the abrasive cloth tries to turn back gets stronger on the wafer outer circumferential portion, which makes it easy to cause roll-off. Further, with a hard abrasive cloth, it is possible to extrude the water-soluble polymer absorbed to the surface to be polished of the silicon wafer in the wafer outer circumferential direction, to efficiently eliminate it, which makes it possible to keep the high polishing rate and improve the quality of the surface roughness of the silicon wafer.

As a hard abrasive cloth, an abrasive cloth composed of a nonwoven cloth made of polyester, an abrasive cloth made of polyurethane, or the like may be cited. In particular, an abrasive cloth made of polyurethane foam, which is excellent in accuracy of mirror-finish onto the surface to be polished of the silicon wafer, is desirable. For example, in the case where an abrasive cloth made of suede which is soft and easy to track the outer circumferential shape of the silicon wafer, which may be used for final polishing, is used, etching on the wafer outer circumferential portion is accelerated, which results in roll-off.

As a specific hard abrasive cloth, it is preferable to adopt an abrasive cloth of 70 to 90 as Shore-D hardness specified by JIS K 6253-1997/ISO 7619, and with compressibility of 1 to 5%, in particular, 2 to 3%. In a case of being lower than 70 as Shore-D hardness, during polishing, the polishing liquid is inhibited from flowing into the outer circumferential portion of the silicon wafer, to reduce the amount of the water-soluble polymer of the outer circumferential portion, thereby increasing the polishing rate of 3 mm from the outer circumferential edge of the silicon wafer, which makes it easy to cause roll-off of the wafer outer circumferential portion. Further, in a case of being higher than 90 as Shore-D hardness, it is easy to cause a polishing flaw on the wafer surface.

Lapping is carried out by relatively rotating the silicon wafer and the abrasive cloth. The term "relatively rotating" means rotating the silicon wafer, rotating the abrasive cloth, or rotating both of the silicon wafer and the abrasive cloth. The rotational directions of the silicon wafer and the abrasive cloth are arbitrary. For example, the rotational directions of the silicon wafer and the abrasive cloth in the case where both are rotated may be the same or different from each other.

The polishing rate of the silicon wafer in rough polishing is preferably 0.05 to 1 µm per minute. Given that the polishing rate is lower than 0.05 µm per minute, the polishing rate is low, and it takes a long time for polishing. Further, given that the polishing rate is higher than 1 µm per minute, it is easy to cause surface roughness of the silicon wafer surface by the highly-concentrated alkali.

The rotation speed of the silicon wafer, the rotation speed of the abrasive cloth, the polishing pressure, and the like may be set to be within a range of the above-described polishing rates, and for example, the rotation speeds of the silicon wafer and the abrasive cloth may be set to be within a range of 5 to 30 rpm, and the polishing pressure may be set to be within a range of 50 to 500 g per cm$^2$.

In addition, the amount of polishing by rough polishing may be set in consideration of a desired silicon wafer thickness, and is basically set to be within a range of several hundreds of nm to 10 µm per minute. The amount of polishing by final polishing carried out after rough polishing is set to be within a range less than or equal to 500 nm at a maximum.

In rough polishing of the silicon wafer, a single-wafer type polishing device may be used, or a batch type polishing device that simultaneously polishes a plurality of silicon wafers may be used. The rough polishing may be one-side polishing only onto the surface or double-side polishing for simultaneously polishing the wafer surface and rear surface.

In particular, for simultaneously rough polishing the wafer surface and rear surface, it is preferable to polish those by use of a double-side polishing device which is equipped with a carrier plate in which a silicon wafer is housed, and an upper surface plate and a lower surface plate on which abrasive cloths inserting the carrier plate from above and below are pasted on the respective opposed surfaces. Thereby, it is possible to achieve high flattening not only the wafer surface, but also the wafer rear surface by one polishing processing, which is effective for providing mirrored silicon wafers at low cost and of high flatness. The abrasive cloth on the upper surface plate and the abrasive cloth on the lower surface plate may be made of the same material, or may be made of different materials.

At the time of carrying out double-side polishing onto the surface and the rear surface of a silicon wafer by use of a polishing liquid with no free abrasive grains, it is preferable to polish the silicon wafer such that the thickness of the silicon wafer after rough polishing is made thicker than the thickness of the carrier plate. Thereby, polishing of the carrier plate by the abrasive cloth is inhibited, which makes it possible to prevent deterioration of the carrier plate. Additionally, during polishing processing, vibration of the wafer and the carrier plate is dampened, which makes it possible to prevent the wafer from jumping out of the carrier plate.

As this double-side polishing device, a sun-gear (planetary gear) system device, or a non-sun gear system device which causes the carrier plate to cause a circular motion without self-rotation may be adopted.

The polishing liquid is used at the time of rough polishing at least the surface serving as a surface to be polished between the surface and the rear surface of a silicon wafer, and in which an alkaline aqueous solution with no free abrasive grains serves as a base compound, and a water-soluble polymer is added to the alkaline aqueous solution.

Because the polishing liquid contains the alkaline aqueous solution with no free abrasive grains serving as a base compound, the surface to be polished of the silicon wafer is polished mainly by a chemical action. As a result, it is possible to avoid generation of process damage by a mechanical action as conventional polishing using free abrasive grains, and it is possible to reduce defect generation caused by a process such as micro-scratching caused by an aggregation of abrasive grains.

Further, in the polishing liquid, the alkaline aqueous solution is adjusted to pH8 to pH13, and any of basic ammonium salt, basic potassic salt, and basic sodium salt is added to the alkaline aqueous solution as an alkaline agent, and the alkaline aqueous solution is an alkaline carbonate aqueous solution, or an alkaline aqueous solution to which an amine is added. The water-soluble polymer is preferably composed of one type or several types from among non-ionic system polymers and monomers, or one type or several types from among anionic system polymers and monomers. With this, defects caused by a process such as scratching or scarring are not generated on the surface of the silicon wafer, it is easy to handle the polishing liquid, and it is possible to obtain a high polishing (etching) rate of the silicon wafer.

The content of the alkaline component in the alkaline aqueous solution is preferably set to 100 to 1000 ppm. When it is less than 100 ppm, the etching force onto the surface of the silicon wafer by the alkali is not sufficient, and it takes a long time for polishing the silicon wafer to a predetermined thickness. When it is over 1000 ppm, it is difficult to handle the polishing liquid itself, and further, surface roughness is easily generated on the wafer surface by an excess etching reaction.

As a water-soluble polymer, it is particularly preferable to contain hydroxyethyl cellulose. Highly-pure hydroxyethyl cellulose is relatively easily available, and a polymer membrane is easily formed on a wafer surface. Therefore, hydroxyethyl cellulose has the characteristic of a high effect of inhibiting an etching reaction by alkali.

The concentration of the hydroxyethyl cellulose in the polishing liquid is preferably set within a range of concentration from 0.1 ppm to 1000 ppm. It is extremely difficult to manage daily the concentration of the water-soluble polymer in the polishing liquid to be within a range of concentration less than 0.1 ppm, and when the concentration is over 1000 ppm, the polishing rate of the silicon wafer is considerably lowered. Additionally, the silicon wafer outer circumferential portion is excessively rolled up, which makes it necessary to considerably increase the amount of polishing by final polishing carried out after rough polishing.

Further, from the standpoint of elimination of metal ions contained in the polishing liquid, it is preferable to add a chelate agent into the polishing liquid. By addition of a chelate agent, metal ions are captured to be complexed, and thereafter, this is discarded, thereby it is possible to reduce the level of metallic pollution of the silicon wafer after polishing. As a chelate agent, any substance having a chelating ability with respect to metal ions may be used. Chelation means bond (coordination) to metal ions by a ligand having a plurality of coordination positions.

Moreover, final polishing is applied on at least the surface of the rough polished silicon wafer. The condition for that is not particularly limited. A single-wafer type polishing device may be used, or a batch type polishing device which simultaneously polishes a plurality of silicon wafers may be used. The final polishing may be one-side polishing only onto the surface or double-side polishing for simultaneously polishing the wafer surface and rear surface.

As a type of the chelate agent, for example, a phosphonate system chelate agent, an aminocarboxylic acid system chelate agent, or the like may be adopted. However, in view of the solubility thereof in the alkaline aqueous solution, an aminocarboxylic acid system chelate agent is favorable. Moreover, in view of a chelating ability with respect to heavy-metal ions, aminocarboxylate such as ethylene diamine tetraacetic acid (Ethylene Diamine Tetraacetic Acid) or diethylene triamine pentaacetic acid (Diethylene Triamine Pentaacetic Acid) is more favorable. Otherwise, nitrilotriacetic acid (NTA) as well may be used. A chelate agent is preferably added within a range of concentration from 0.1 ppm to 1000 ppm, thereby, it is possible to capture metal ions such as Cu, Zn, Fe, Cr, Ni, or Al.

Hereinafter, examples of this invention will be described in detail. Here, a method for manufacturing a double-side polished silicon wafer whose surface and rear surface are polished, and a polishing liquid for the method will be described.

Example 1

A method for polishing silicon wafers and a polishing liquid therefor according to Example 1 of the present invention will be described. In Example 1, the rough polishing process is split into two steps to be carried out. As a primary polishing process, the polishing was carried out by use of a polishing liquid containing free abrasive grains in order to eliminate a native oxide film present on the wafer surface, and as a secondary polishing process, the polishing was carried out by use of a polishing liquid with no free abrasive grains in order to achieve flattening of the silicon wafer.

The double-side polished silicon wafer whose surface and rear surface are mirror-surface polished is manufactured through the following respective processes.

That is, a monocrystalline silicon ingot with a diameter of 306 mm, a length of its straight body of 2500 mm, a specific resistance of 0.01 $\Omega \cdot cm$, and initial oxygen concentration of $1.0 \times 10^{18}$ atoms/cm$^3$ is pulled up by the Czochralski method from a melting liquid for silicon doped with a predetermined amount of boron in a crucible.

Next, after the one monocrystalline silicon ingot is cut into a plurality of crystalline blocks, grinding of the outer circumferences of the respective crystalline blocks is carried out. Next, a large number of silicon wafers with a diameter of 300 mm and a thickness of 775 μm are sliced from a silicon monocrystal by three grooved roller wires which are triangularly-arranged.

Thereafter, a chamfering grinding stone in rotation is pressed against the outer circumferential portion of the silicon wafer to carry out chamfering, and next, both surfaces of the silicon wafer are simultaneously lapped with a double-side lapping device. Next, the silicon wafer after the lapping is dipped in an acid etching solution in an etching tank to be etched, thereby eliminating damage by the chamfering and the lapping. Thereafter, primary polishing and secondary polishing are sequentially applied onto the surface and the rear surface of the silicon wafer.

In the primary polishing process, primary polishing is simultaneously carried out onto the surface and the rear surface of the silicon wafer by use of a primary polishing liquid by using a non-sun gear system double-side polishing device 10. A primary polishing liquid of pH10 containing a KOH solution of 0.08% by weight, which contains colloidal silica particles (free abrasive grains) with an average particle diameter of 70 nm, of 5% by weight is used. With this, the native oxide films formed on the surface and the rear surface of the silicon wafer are eliminated mainly by a mechanical action of the free abrasive grains.

Hereinafter, the non-sun gear system double-side polishing device 10 will be described in detail with reference to FIGS. 1 and 2.

Figure 2:
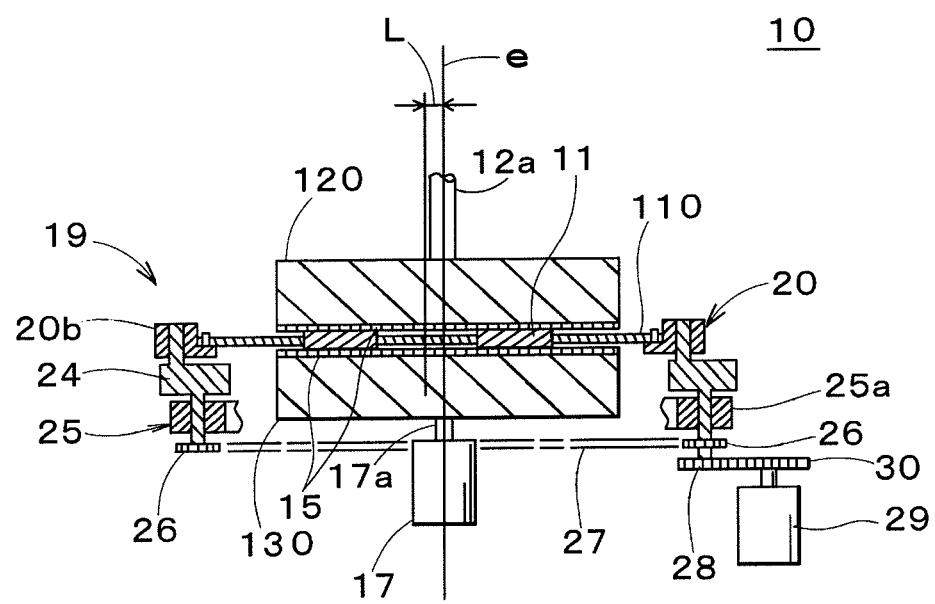
FIG. 2 is a major part longitudinal sectional view of the non-sun gear system double-side polishing device, which is used for the method for polishing silicon wafers of Example 1 according to the present invention.

As shown in FIGS. 1 and 2, an upper surface plate 120 of the double-side polishing device 10 is driven to rotate in a horizontal plane by an upper side rotary motor 16 via a rotary shaft 12a extended upward. Further, the upper surface plate 120 is lifted up and down in a vertical direction by a lifting and lowering device 18 that moves it forward and backward in a direction of axis. The lifting and lowering device 18 is used at the time of supplying and discharging a silicon wafer 11 to and from a carrier plate 110. In addition, polishing pressure onto the surface and the rear surface of the silicon wafer 11 from the upper surface plate 120 and the lower surface plate 130 is 300 g/cm$^2$, which is applied by unillustrated pressurizing means of an air-bag system or the like, which are built in the upper surface plate 120 and the lower surface plate 130. The lower surface plate 130 is rotated in a horizontal plane by a lower side rotary motor 17 via an output shaft 17a thereof. The carrier plate 110 has a thickness of 750 µm, and causes a circular motion in a plane parallel to the surface of the plate 110 (horizontal plane) by a carrier circular motion mechanism 19 such that the plate 110 itself does not rotate.

The carrier circular motion mechanism 19 has a ring-like carrier holder 20 holding the carrier plate 110 from the outside. The carrier circular motion mechanism 19 and the carrier holder 20 are interlocked via an interlocking structure.

Four bearings 20b projecting outward are disposed at every 90° at the outer circumferential portion of the carrier holder 20. Leading end portions of eccentric shafts 24a provided to project at eccentric positions on the upper surfaces of small-diameter and disc shaped eccentric arms 24 are rotatably inserted into the respective bearings 20b. Further, rotary shafts 24b are installed vertically to the central portions of the respective bottom surfaces of these four eccentric arms 24. The respective rotary shafts 24b are rotatably inserted into four bearings 25a in total disposed at every 90° to a ring-like device base body 25, so as to respectively project their leading end portions downward. Sprockets 26 are firmly fixed respectively to the leading end portions projecting downward, of the respective rotary shafts 24b. A timing chain 27 is, as a string in a horizontal state, bridged over the respective sprockets 26. These four sprockets 26 and the timing chain 27 simultaneously rotate the four rotary shafts 24b such that the four eccentric arms 24 synchronously cause a circular motion.

Among the four rotary shafts 24b, one rotary shaft 24b is formed longer, and its leading end portion projects downward from the sprocket 26. A gear 28 for power transmission is firmly fixed to this portion. The gear 28 is geared with a large-diameter gear 30 for driving which is firmly fixed to the output shaft extended upward of a circular motion motor 29.

Accordingly, when the circular motion motor 29 is started, its torque is transmitted to the timing chain 27 sequentially through the gears 30 and 28, and the sprocket 26 firmly fixed to the longer rotary shaft 24b. Due to the timing chain 27 cycling, the four eccentric arms 24 synchronously rotate in the horizontal plane centering on the rotary shafts 24b via the other three sprockets 26. Thereby, the carrier holder 20 collectively interlocked with the respective eccentric shafts 24a, that is the carrier plate 110 held by the holder 20 causes a circular motion without self-rotation in the horizontal plane parallel to the plate 110.

That is, the carrier plate 110 circles while keeping a state of being eccentric by a distant L from a shaft line e of the upper surface plate 120 and the lower surface plate 130. The abrasive cloths 15 made of urethane foam resin, of 80 as Shore-D hardness and with compressibility of 2.5% are pasted on the respective opposed surfaces of both surface plates 120 and 130.

The aforementioned distance L is the same as the distance between the eccentric shaft 24a and the rotary shaft 24b. All the points on the carrier plate 110 draw a small round trajectory of the same size (radius r) by the circular motion without self-rotation. Thereby, the simultaneous double-side primary polishing was carried out such that the silicon wafer 11 housed in a wafer housing portion 11a formed in the carrier plate 110 has the amount of polishing of 0.5 µm on one side (1 µm on both sides) by setting the rotational directions of both polishing surface plates 120 and 130 opposed, and adjusting the rotational speed of the polishing surface plates 120 and 130, the polishing pressure (300 g/cm$^2$), the polishing time, and the like. During this double-side primary polishing, the primary polishing processing was carried out for three minutes while supplying a primary polishing liquid of pH10 in which colloidal silica particles with an average particle diameter of 70 nm, and of 5% by weight are added to a KOH solution of 0.08% by weight, to both abrasive cloths 15 at 9 liters per minute.

In this way, the polishing solution in which the KOH solution containing free abrasive grains is added is adopted as a polishing liquid for primary polishing. Therefore, as a pretreatment before the secondary polishing without the intervention of free abrasive grains, it is possible to eliminate the respective native oxide films of approximately 10 Å present on the surface and the rear surface of the silicon wafer 11 for a short time mainly by a mechanical action of the free abrasive grains. Thereby, it is possible to perform mirror-surface polishing using a piperidine solution which will be described later at a high polishing rate in secondary polishing.

That is, in primary polishing carried out after the elapse of a predetermined time after etching, generally, a native oxide film is present on the wafer surface. It is difficult to eliminate the native oxide film by only chemical secondary polishing with no free abrasive grains. Therefore, the primary polishing using the free abrasive grains was applied before the secondary polishing, making it possible to shorten the time for eliminating the native oxide film, and prevent deterioration in productivity of the mirror-polished silicon wafers 11.

Next, secondary polishing is carried out onto the surface and the rear surface of the silicon wafer 11 by use of a secondary polishing liquid with no abrasive grains. In detail, the surface and the rear surface of the silicon wafer 11 are secondarily polished (mirror-polished) by use of a secondary polishing liquid of pH10.5 in which hydroxyethyl cellulose (HEC; water-soluble polymer) of $1 \times 10^{-3}$% by weight (10 ppm) is added to a piperidine solution with no free abrasive grains and of 0.08% by weight, by using the non-sun gear system double-side polishing device 10 used for the primary polishing. That is, the simultaneous double-side secondary polishing is carried out such that the silicon wafer 11 housed in the wafer housing portion 11a of the carrier plate 110 has the amount of polishing of 5 µm on one side (10 µm on both sides) at a polishing rate of 0.5 µm per minute by setting the rotational directions of both polishing surface plates 120 and 130 opposed, and adjusting the rotational speed of the polishing surface plates 120 and 130, the polishing pressure, the polishing time, and the like. During this secondary polishing, the secondary polishing liquid is supplied to both abrasive cloths 15. The other polishing conditions are the same as those in the case of primary polishing. In addition, because the thickness of the carrier plate 110 is 750 µm, and the thickness of the silicon wafer 10 after secondary polishing is 764 µm, the silicon wafer 10 maintains a state in which the silicon wafer 10 is thicker than the carrier plate even after the rough polishing.

In this way, the silicon wafer 11 from which the native oxide films are eliminated and the abrasive cloths 15 are relatively rotated while supplying the secondary polishing liquid in which hydroxyethyl cellulose is added to the piperidine solution with no free abrasive grains to the abrasive cloth, to polish the surface and the rear surface of the silicon wafer 11 by 5 µm on one side. At this time, the abrasive cloths 15 are pressed against the surface and the rear surface of the silicon wafer 11 by the action of polishing pressure, and the hydroxyethyl cellulose membrane in the polishing liquid adhering to the surfaces of the silicon wafer 11 is taken away from the surface to be polished of the silicon wafer 11, and the polishing progresses in that state in which the hydroxyethyl cellulose adheres to the outer circumferential portion of the silicon wafer 11. Therefore, the surface and the rear surface of the silicon wafer 11 are polished at a high polishing rate of 0.5 μm per minute while keeping high flatness by an etching action of the alkaline aqueous solution and an action of eliminating hydroxyethyl cellulose by the abrasive cloths 15.

Further, because the surface and the rear surface of the silicon wafer 11 are polished mainly by a chemical action, it is possible to avoid generation of process damage by a mechanical action such as conventional polishing using free abrasive grains. In addition, because the polishing does not use free abrasive grains, it is possible to reduce defect generation caused by a process such as micro-scratching caused by an aggregation of abrasive grains.

On the other hand, because the hard abrasive cloths made of polyurethane foam are used for the outer circumferential edge of the silicon wafer 11, and hydroxyethyl cellulose is added into the polishing liquid, the abrasive cloths are always inhibited from adhering to the outer circumferential surface (chamfering plane) of the silicon wafer 11 during polishing. Thereby, covering the wafer outer circumferential surface with the hydroxyethyl cellulose in the polishing liquid becomes a protective film for the wafer outer circumferential surface with respect to etching. As a result, the polishing rate of 3 mm from the outer circumferential portion of the silicon wafer 11 is lowered, and it is possible to reduce roll-off of the wafer outer circumferential portion, which results in making capable flatness control of the wafer outer circumferential portion including roll-off and roll-up. In addition, the reason for that a certain level of roll-up is allowed to occur on the wafer outer circumferential portion, is because it is possible to suppose balancing-out with roll-off of the outer circumferential portion of the silicon wafer 11 in advance in final polishing thereafter.

In contrast thereto, for example, in the case where soft abrasive cloths made of suede are used, the abrasive cloths disposed above and below touch the outer circumferential surfaces of the silicon wafer 11, thereby promoting roll-off of the outer circumferential portion of the silicon wafer 11.

Further, because the hydroxyethyl cellulose is adopted as a water-soluble polymer, a polymer membrane is formed on the outer circumferential portion of the silicon wafer 11, which leads to an effect that it is possible to inhibit an etching action by the piperidine solution. Further, this is extremely highly-pure, which makes it possible to reduce impurity contamination.

Further, because the concentration of the hydroxyethyl cellulose in the secondary polishing liquid is set to 10 ppm, no defect caused by a process is present on the surface and the rear surface of the silicon wafer 11, and it is possible to polish the silicon wafer 11 in which roll-off of the wafer outer circumferential portion is reduced, for a short time.

Because the alkaline aqueous solution which is adjusted to be within a range of pH10.5 is adopted, defects caused by a process such as scratching or scarring are not generated on the surface of the silicon wafer 11, it is easy to handle the polishing liquid, and it is possible to obtain a high polishing rate of the silicon wafer 11.

Further, because expanded polyurethane resin is adopted as a material of both abrasive cloths 15, it is possible to reduce the roll-off amount of the outer circumferential portion of the silicon wafer 11.

Thereafter, final polishing is applied onto the surface and the rear surface of the secondary-polished silicon wafer 11 under predetermined conditions, and final-cleaning is further carried out. Here, SC1 cleaning using an alkaline solution and an acid solution is carried out onto the respective silicon wafers 11.

Example 2

A method for polishing silicon wafers and a polishing liquid therefor according to Example 2 of the present invention will be described. In Example 2, the secondary polishing process carried out in the present example is further split into two steps (first-step polishing and second-step polishing) to be carried out. The polishing was carried out such that, in the secondary polishing (first-step polishing), the concentration of the water-soluble polymer in the polishing liquid is set to be a low concentration in order to increase the polishing rate of the silicon wafer 11, and in the tertiary polishing (second-step polishing), the concentration of the water-soluble polymer in the polishing liquid is set to be a high concentration in order to inhibit a roll-off amount of the outer circumferential portion of the silicon wafer 11.

In the invention of Example 2, secondary polishing (first-step polishing) which is the same as the secondary polishing in Example 1 is applied except for the point that hydroxyethyl cellulose of $1\times10^{-5}$% by weight (0.1 ppm) is added into the secondary polishing liquid, and the amount of polishing of the surface and the rear surface of the silicon wafer 11 is set to 4.5 μm on one surface (9 μm on both surfaces), and thereafter, the surface to be polished of the silicon wafer 11 is tertiary-polished (second-step polished) by use of the tertiary polishing liquid containing high concentration hydroxyethyl cellulose as compared with the secondary polishing liquid with respect to the silicon wafer 11.

Specifically, the concentration of hydroxyethyl cellulose in the tertiary polishing liquid used for tertiary polishing is set to $1\times10^{-2}$% by weight (100 ppm), and the amount of polishing of the surface and the rear surface of the silicon wafer 11 is set to 0.5 μm on one surface (1.0 mm on both surfaces).

In this way, because the secondary polishing of the amount of polishing of 4.5 μm on one surface of the wafer is applied to the surface and the rear surface of the silicon wafer 11 by use of the secondary polishing liquid in which the concentration of hydroxyethyl cellulose is $1\times10^{-5}$% by weight (0.1 ppm), it is possible to rough polish the surface and the rear surface of the silicon wafer 11 at a high polishing rate. Because the tertiary polishing of 0.5 μm on one surface of the wafer is thereafter applied to the surface and the rear surface of the silicon wafer 11 by use of the tertiary polishing liquid in which the concentration of hydroxyethyl cellulose is increased to $1\times10^{-2}$% by weight (100 ppm), it is possible to reduce roll-off of the outer circumferential portion of the silicon wafer 11, which results in making capable flatness control of the wafer outer circumferential portion including roll-off and roll-up. As a result, a polishing time of the silicon wafer 11 on which roll-off of the outer circumferential portion is reduced is shortened, which makes it possible to improve productivity of the double-side mirror polished silicon wafers 11.

In particular, because the concentration of hydroxyethyl cellulose used in the tertiary polishing liquid is set to 100 ppm, it is possible to reduce roll-off as low as possible at the outer circumferential portion of the silicon wafer 11.

In addition, because the other configurations (including the other polishing conditions for tertiary polishing), and the action and effect are the same as those in Example 1, descriptions thereof will be omitted.

Figure 3:
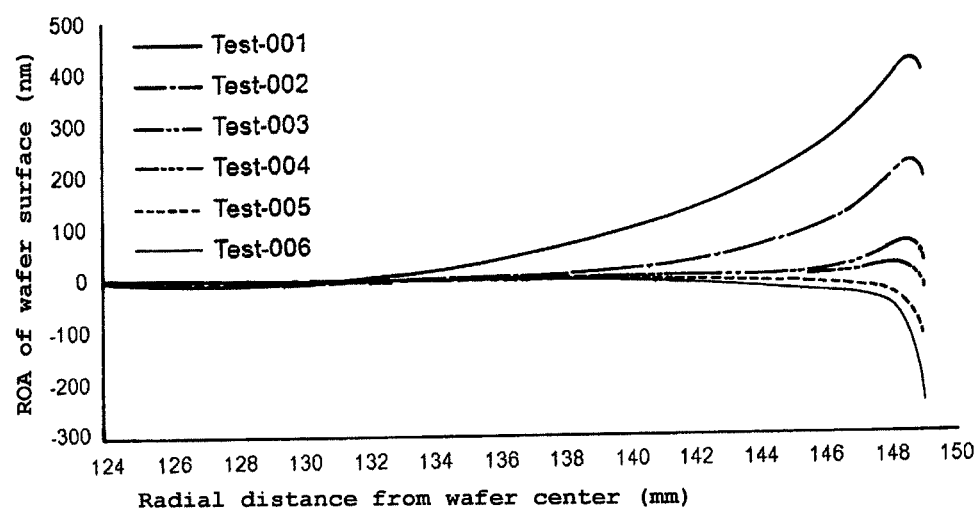
FIG. 3 is a graph showing the shapes of outer circumferential portions of the silicon wafers corresponding to the additive amounts of a water-soluble polymer with respect to silicon wafers, which are secondary-polished by the method for polishing silicon wafers of Example 1 according to the present invention.
Figure 4:
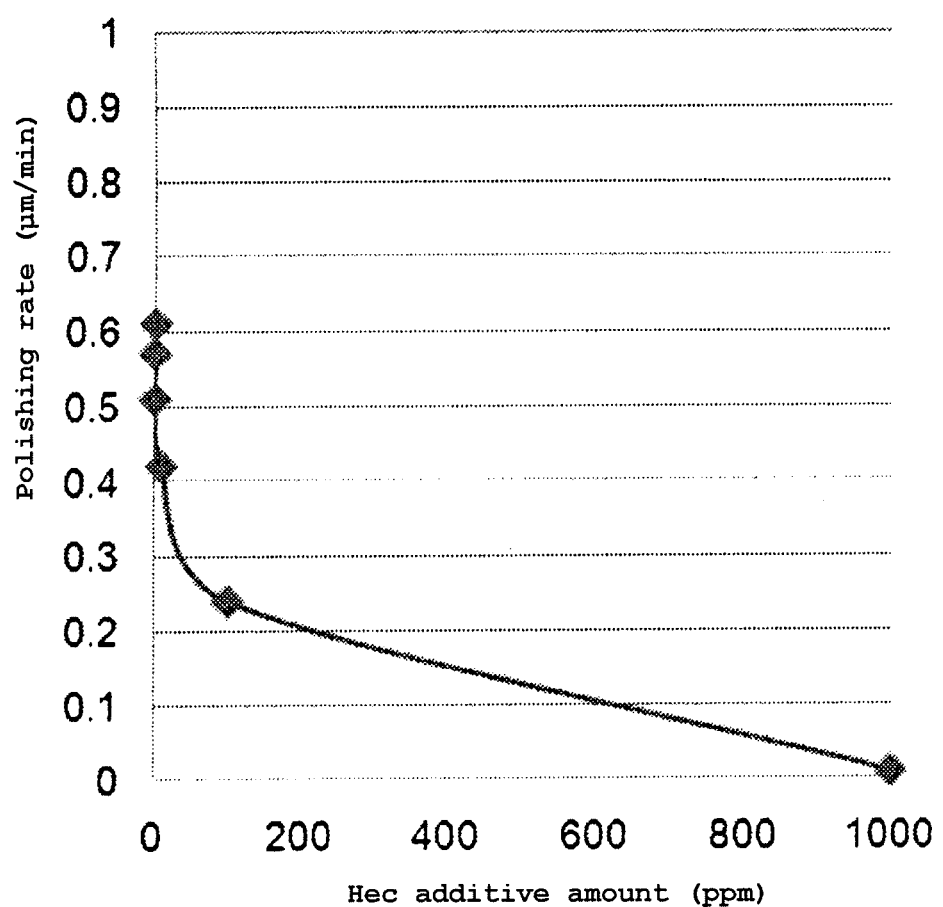
FIG. 4 is a graph showing a relationship between the additive amounts of hydroxyethyl cellulose into a polishing liquid and the polishing rates of the silicon wafer in the method for polishing silicon wafers of Example 1 according to the present invention.

Next, with reference to the graphs of FIGS. 3 and 4, and tables 1 and 2, the results of actual application of primary polishing containing free abrasive grains and secondary polishing with no free abrasive grains by the polishing liquid of Example 1 of the present invention and the methods for polishing silicon wafers using the polishing liquid (Test Examples 1 to 5), and by a conventional method for polishing silicon wafers using a polishing liquid with no hydroxyethyl cellulose (Comparison Example 1) are reported. The other test conditions for the Comparison Example 1 conform to those of Example 1 in the same way as those in the Test Examples 1 to 5.

In the primary polishing process, polishing was carried out for three minutes while supplying the primary polishing liquid containing free abrasive grains (the alkaline aqueous solution containing colloidal silica of 5% by weight and a KOH solution of 0.08% by weight) to both abrasive cloths at 9 liters per minute, to eliminate the oxide films on the surface and the rear surface of the silicon wafer. Next, in the secondary polishing process, the surface and the rear surface of the silicon wafer were secondarily-polished while supplying a secondary polishing liquid in which hydroxyethyl cellulose (hereinafter called HEC) of $1 \times 10^{-5}$ to $1 \times 10^{-1}$% by weight is added to an alkaline aqueous solution with no free abrasive grains, which contains piperidine of 0.08% by weight at 9 liters per cm².

In addition, provided that a polishing liquid containing an alkaline aqueous solution with no free abrasive grains and a water-soluble polymer is used, and a wafer holding system by a carrier plate is adopted in the secondary polishing, the carrier plate vibrates because the silicon wafer moves in the wafer holding hole during polishing, which brings concern that the silicon wafer will jump out of the wafer holding hole during polishing. Then, in the secondary polishing, the secondary polishing is terminated in a state in which the thickness of the silicon wafer is thicker by approximately 20 μm than the thickness of the carrier plate. Table 1 shows the ratio of components in the secondary polishing liquid, and the graph of FIG. 3 shows the shapes of the outer circumferential portions of the silicon wafers after the polishing. For measuring the shapes of the outer circumferential portions of the silicon wafers, the WaferSight manufactured by KLA-Tencor Corporation was used.

TABLE 1

| TEST | Polishing accelerator (Concentration) | Abrasive grains (Concentration) | Water-soluble polymer (Concentration) |
| --- | --- | --- | --- |
| TEST-001 | Piperidine (0.08% by weight) | — | Hydroxyethyl cellulose ($10^{-1}$ % by weight) |
| TEST-002 | | | Hydroxyethyl cellulose ($10^{-2}$ % by weight) |
| TEST-003 | | | Hydroxyethyl cellulose ($10^{-3}$ % by weight) |
| TEST-004 | | | Hydroxyethyl cellulose ($10^{-4}$ % by weight) |
| TEST-005 | | | Hydroxyethyl cellulose ($10^{-5}$ % by weight) |
| TEST-006 | | | — |

TEST001 to TEST005 show Test Examples 1 to 5, and TEST006 shows Comparison Example 1 with no hydroxyethyl cellulose.

To express a shape of roll-off of the outer circumference of the silicon wafer, a Roll-Off Amount (hereinafter called ROA) is adopted. One dimension (line) is used as a reference plane for measurement, and 124 mm to 135 mm in a diametrical direction of the silicon wafer is set as a reference range thereof. In addition, for the ROA notation, distances from the reference plane at a position of 1 mm (ROA 1 mm) and a position of 2 mm (ROA 2 mm) from the outer edge (outermost edge) of the silicon wafer were measured. Table 2 shows these measured values.

TABLE 2

| TEST | ROA 1 mm | ROA 2 mm |
| --- | --- | --- |
| TEST-001 | +391.1 | +384.6 |
| TEST-002 | +187.8 | +193.39 |
| TEST-003 | +26.0 | +57.2 |
| TEST-004 | −16.5 | +21.7 |
| TEST-005 | −110.0 | −29.4 |
| TEST-006 | −240.02 | −55.11 |

As is clear from the graph of FIG. 3 and Table 2, by adjusting the concentration of hydroxyethyl cellulose to be within a range of $1 \times 10^{-5}$ to $1 \times 10^{-1}$% by weight (0.1 to 1000 ppm), it is possible to control the ROA 1 mm notation within a range of −110 nm to +390 nm. In the case where no hydroxyethyl cellulose is contained and the concentration thereof is low ($1 \times 10^{-5}$% by weight), roll-off is generated at the outer circumferential portion of the silicon wafer. Meanwhile, the higher the concentration of hydroxyethyl cellulose is, the more the wafer outer circumferential portion is rolled up.

In addition, as is clear from the graph of FIG. 4, when the concentration of hydroxyethyl cellulose is increased, the polishing rate (Elimination Rate) tends towards lowering. This may indicate a protective effect for the surface of the silicon wafer by hydroxyethyl cellulose, and it can be considered that a reaction (etching action) between alkali and the silicon wafer is interfered by hydroxyethyl cellulose.

Figure 5:
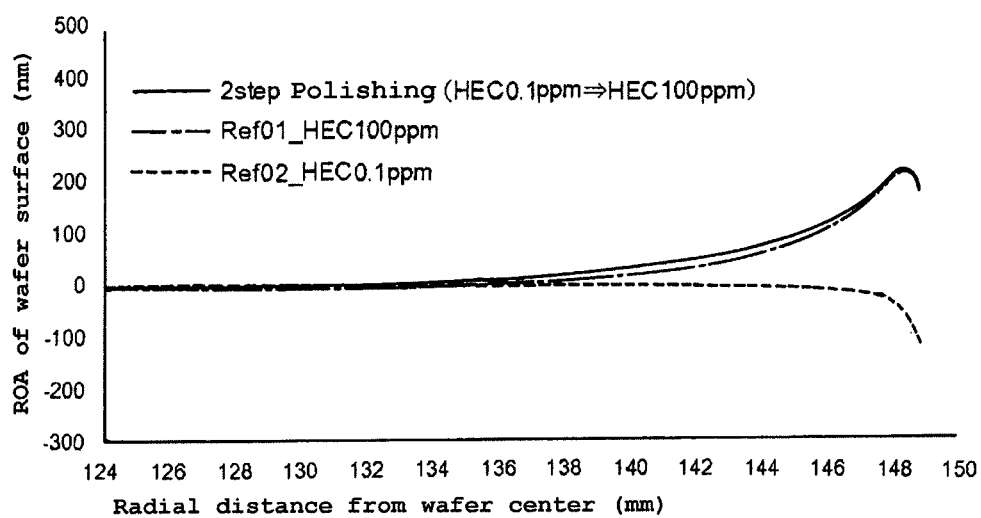
FIG. 5 is a graph showing the shapes of the outer circumferential portions of the silicon wafers corresponding to the additive amounts of a water-soluble polymer with respect to silicon wafers, which are tertiary-polished by a method for polishing silicon wafers of Example 2 according to the present invention.

Next, with reference to the graphs of FIG. 5, and Tables 3 and 4, the results of actual application of two-step polishing in which the concentration of hydroxyethyl cellulose is made to differ, to the silicon wafer by the polishing liquid of Example 2 of the present invention and a method for polishing silicon wafers using the polishing liquid (Test Example 6) are reported.

That is, in the case where a desired ROA is in a roll-up (plus side) state, although depending on the concentration of hydroxyethyl cellulose, the polishing rate may be lowered, which may greatly hinder the productivity. Then, a method in which the concentration of hydroxyethyl cellulose is arbitrarily changed during polishing to satisfy both of productivity of a silicon wafer and inhibition of roll-off was tested. The graph of FIG. 5 shows the results. In the graph of FIG. 5, Ref02 shows only the secondary polishing, Ref01 shows only the tertiary polishing, and 2step polishing shows Test Example 6 in which the tertiary polishing was applied after the secondary polishing.

Further, Table 3 shows the ratios of components of the primary polishing liquid used for the primary polishing process, the secondary polishing liquid used for the secondary polishing process, and the tertiary polishing liquid used for the tertiary polishing process. In addition, in Table 3, the term "abrasive grains" means free abrasive grains in colloidal silica.

TABLE 3

| STEP | Polishing accelerator (Concentration) | Abrasive grains (Concentration) | Water-soluble polymer (Concentration) |
| --- | --- | --- | --- |
| Primary polishing | KOH (0.08% by weight) | 5.0% by weight | |
| Secondary polishing | Piperidine (0.08% by weight) | — | Hydroxyethyl cellulose ($10^{-5}$ % by weight) |

TABLE 3-continued

| STEP | Polishing accelerator (Concentration) | Abrasive grains (Concentration) | Water-soluble polymer (Concentration) |
|---|---|---|---|
| Tertiary polishing | Piperidine (0.08% by weight) | — | Hydroxyethyl cellulose ($10^{-2}$ % by weight) |

In the secondary polishing process, the surface and the rear surface of the silicon wafer were polished by 4.5 μm on one side for 15 minutes while supplying the secondary polishing liquid to both abrasive cloths at 9 liters per cm². In the tertiary polishing process, the surface and the rear surface of the silicon wafer were polished by 0.5 μm on one side for 3 minutes while supplying the tertiary polishing liquid to both abrasive cloths at 9 liters per cm². The other test conditions are the same as those in the case of Test Examples 1 to 5.

In this test, to express the roll-off shape of the outer circumferential portion of the silicon wafer, distances from the reference plane at a position of 1 mm (ROA 1 mm) and a position of 2 mm (ROA 2 mm) from the outer edge (outermost edge) of the silicon wafer were measured. Table 4 shows these measured values.

TABLE 4

| TEST | ROA 1 mm | ROA 2 mm |
|---|---|---|
| 2Step Polishing (HEC 0.1 ppm⇒ HEC 100 ppm) | +178.3 | +199.63 |
| Ref01__HEC 100 ppm | +187.8 | +193.39 |
| Ref02__HEC 0.1 ppm | +26.0 | +57.2 |

As is clear from Table 4, in the second-step polishing in which the concentration of hydroxyethyl cellulose is made to differ in Test Example 6, the roll-off shape which is equivalent to that in the case of the desired roll-off shape in which the hydroxyethyl cellulose of only $1×10^{-2}$% by weight (100 ppm) is added was realized. In addition, the added amount of polishing of the secondary polishing and the tertiary polishing in Test Example 6 was 9.6 μm. However, in a case where the roll-off in Test Example 6 is realized in one step, in calculation by reference to the polishing rate when an additive amount of hydroxyethyl cellulose in Example 1 is $1×10^{-2}$% by weight, 38 minutes was required for 9.6 μm/(0.25 mm per minute) as a polishing time in the first-step polishing. On the other hand, 19 minutes is sufficient in the second-step polishing in Test Example 6. Therefore, the shortened time for polishing possible by the second-step polishing is that 38 minutes-19 minutes=19 minutes, which shows that the productivity was improved by 50%.
This is shown in Table 5.

Moreover, the amount of polishing when an additive amount of hydroxyethyl cellulose by this test is $1×10^{-2}$% by weight, was 0.75 μm (0.25 μm per minute×three minutes) from the results shown in FIG. 4 of Example 1.

TABLE 5

| TEST | Amount of polishing (μm) | Polishing time (min) | Removal rate (μm/min) | Polishing time shortening effect (min) |
|---|---|---|---|---|
| 2Step polishing (HEC 0.1 ppm ⇒ HEC 100 ppm) | 9.6 | 19 | 0.50 | 19.2 |
| Assume 1Step (HEC 100 ppm) | 9.6 | 38 | 0.25 | |

The invention claimed is:

1. A method for polishing silicon wafers comprising the steps of:
eliminating a native oxide film formed on a silicon wafer by using an alkaline aqueous solution containing free abrasive grains as a primary polishing liquid;
simultaneously rough polishing a surface and a rear surface of the silicon wafer with a double-sided polisher having a carrier plate in which the silicon wafer is housed, an upper surface plate in which a hard abrasive cloth is pasted on a lower surface, and a lower surface plate in which the hard abrasive cloth is pasted on a top surface, wherein the upper surface plate and the lower surface plate hold the carrier plate respectively from above and below therebetween, so as to relatively rotate the silicon wafer and the hard abrasive cloth while supplying a secondary polishing liquid in which hydroxyethyl cellulose is added to an alkaline aqueous solution with no free abrasive grains, to the hard abrasive cloth; and
applying final polishing on at least the rough polished surface of the silicon wafer, wherein:
the hard abrasive cloth has Shore-D hardness of 70 to 90 and a compressibility of 1 to 5%,
a polishing rate of the silicon wafer in the rough polishing is 0.05 to 1 μm per minute, and
the final polishing is carried out with a soft abrasive cloth and is performed with a third polishing liquid containing free abrasive grains.

2. The method for polishing silicon wafers according to claim 1, wherein the water-soluble polymer is one type or several types from among non-ionic system polymers and monomers, or one type or several types from among anionic system polymers and monomers.

3. The method for polishing silicon wafers according to claim 2, wherein the water-soluble polymer is hydroxyethyl cellulose.

4. The method for polishing silicon wafers according to claim 3, wherein the concentration of the hydroxyethyl cellulose in the polishing liquid is 0.1 ppm to 1000 ppm.

5. The method for polishing silicon wafers according to claim 1, wherein
the alkaline aqueous solution is adjusted to pH8 to pH13, and
the alkaline aqueous solution is the alkaline aqueous solution to which any of basic ammonium salt, basic potassic salt, and basic sodium salt is added as an alkaline agent, or an alkaline carbonate aqueous solution, or an alkaline aqueous solution to which an amine is added.

6. The method for polishing silicon wafers according to claim 1, wherein the abrasive cloth is composed of a non-woven cloth made of polyester, or is made of polyurethane.

7. The method for polishing silicon wafers according to claim 1, wherein polishing is carried out such that a thickness of the silicon wafer after the rough polishing is made thicker than a thickness of the carrier plate.

8. The method for polishing silicon wafers according to claim 1, further comprising:

adjusting the concentration of the hydroxyethyl cellulose to be from 0.1 ppm to 1000 ppm, and controlling an ROA of the silicon wafer to be from −110 nm to +390 nm in 1 mm notation.

9. A method for polishing silicon wafers comprising the steps of:

rough polishing at least the surface serving as a surface to be polished between a surface and a rear surface of the silicon wafer so as to relatively rotate a silicon wafer and an abrasive cloth; and applying final polishing on at least the rough polished surface of the silicon wafer after the rough polishing, the method wherein the rough polishing is split into a first-step polishing which is carried out while supplying a first-step polishing liquid in which a water-soluble polymer is added to an alkaline aqueous solution with no free abrasive grains to the abrasive cloth, and a second-step polishing which is carried out while supplying a second-step polishing liquid in which a water-soluble polymer is added to an alkaline aqueous solution with no free abrasive grains to the abrasive cloth after the first-step polishing, and concentration of the water-soluble polymer in the second-step polishing liquid is made higher than the concentration of the water-soluble polymer in the first-step polishing liquid.

* * * * *